United States Patent
Whang et al.

(10) Patent No.: US 9,385,135 B2
(45) Date of Patent: Jul. 5, 2016

(54) NONVOLATILE MEMORY DEVICE AND METHOD FOR FABRICATING THE SAME

(71) Applicant: SK hynix Inc., Gyeonggi-do (KR)

(72) Inventors: Sung-Jin Whang, Gyeonggi-do (KR);
Dong-Sun Sheen, Gyeonggi-do (KR);
Seung-Ho Pyi, Gyeonggi-do (KR);
Min-Soo Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/572,434

(22) Filed: Dec. 16, 2014

(65) Prior Publication Data

US 2015/0099337 A1  Apr. 9, 2015

Related U.S. Application Data

(62) Division of application No. 13/605,213, filed on Sep. 6, 2012, now Pat. No. 8,928,059.

(30) Foreign Application Priority Data

Apr. 5, 2012 (KR) ........................ 10-2012-0035610

(51) Int. Cl.
*H01L 21/28* (2006.01)
*H01L 27/115* (2006.01)
*H01L 29/66* (2006.01)
*H01L 29/788* (2006.01)

(52) U.S. Cl.
CPC .... *H01L 27/11556* (2013.01); *H01L 21/28273* (2013.01); *H01L 29/66825* (2013.01); *H01L 29/7889* (2013.01)

(58) Field of Classification Search
CPC ................... H01L 27/11556; H01L 21/28273; H01L 29/66825
See application file for complete search history.

(56) References Cited

U.S. PATENT DOCUMENTS

| 7,476,614 | B2 * | 1/2009 | Kwak | ............... H01L 21/28531 257/E21.167 |
| 2010/0112769 | A1 * | 5/2010 | Son | ..................... H01L 21/8221 438/261 |
| 2012/0001252 | A1 * | 1/2012 | Alsmeier | .......... H01L 27/11551 257/321 |

* cited by examiner

*Primary Examiner* — Mark Tornow
(74) *Attorney, Agent, or Firm* — IP & T Group LLP (57) ABSTRACT

A nonvolatile memory device includes a substrate; a channel layer projecting from a surface of the substrate, in a direction perpendicular to the surface; a tunnel dielectric layer surrounding the channel layer; a plurality of interlayer dielectric layers and a plurality of control gate electrodes alternately formed along the channel layer; floating gate electrodes interposed between the tunnel dielectric layer and the plurality of control gate electrodes, the floating gate electrodes comprising a metal-semiconductor compound; and a charge blocking layer interposed between each of the plurality of control gate electrodes and each of the plurality of floating gate electrodes.

9 Claims, 9 Drawing Sheets

NONVOLATILE MEMORY DEVICE AND METHOD FOR FABRICATING THE SAME

CROSS-REFERENCE TO RELATED APPLICATIONS

This application is a division of U.S. patent application Ser. No. 13/605,213 filed on Sep. 6, 2012, which claims priority of Korean Patent Application No. 10-2012-0035610, filed on Apr. 5, 2012. The disclosure of each of the foregoing applications is incorporated herein by reference in its entirety.

BACKGROUND

Exemplary embodiments of the present invention relate to a nonvolatile memory device and a method for fabricating the same, and more particularly, to a nonvolatile memory device having a three-dimensional structure in which a plurality of memory cells are stacked perpendicular to a surface of a substrate, and a method for fabricating the same.

DESCRIPTION OF THE RELATED ART

A nonvolatile memory device is a memory device in which stored data are maintained as they are even when a power supply is interrupted. Currently, various nonvolatile memory devices, such as a flash memory, have been widely used.

Recently, as improving the degree of integration in a nonvolatile memory device with a two-dimensional structure, in which memory cells are formed in a single layer on a semiconductor substrate, reaches a limit, a nonvolatile memory device with a three-dimensional structure, in which a plurality of memory cells are formed along a channel layer vertically projecting from a semiconductor substrate, has been suggested. In detail, such a nonvolatile memory device with a three-dimensional structure is divided into a structure in which charges are stored in floating gate electrodes, and in which charges are stored in a charge trap layer.

Figure 1:
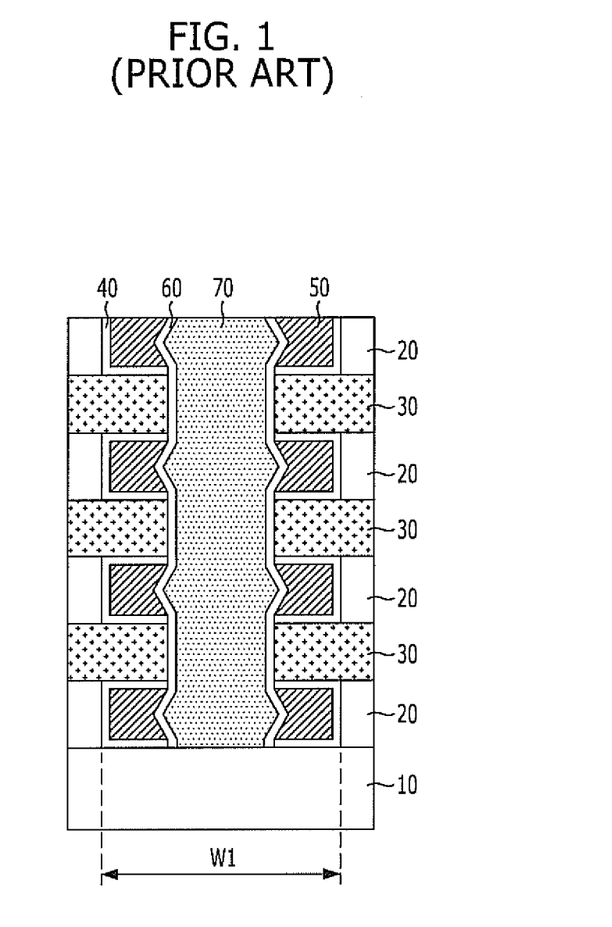
FIG. 1 is a cross-sectional view illustrating a conventional nonvolatile memory device with a three-dimensional structure.

FIG. 1 is a cross-sectional view illustrating a conventional nonvolatile memory device with a three-dimensional structure.

Referring to FIG. 1, a conventional nonvolatile memory device with a three-dimensional structure that has floating gate electrodes may include a plurality of interlayer dielectric layers 20 and a plurality of control gate electrodes 30 that are alternately stacked on a substrate 10, a channel layer 70 that passes through the interlayer dielectric layers 20 and the control gate electrodes 30, a tunnel dielectric layer 60 that surrounds the channel layer 70, floating gate electrodes 50 that are interposed between the interlayer dielectric layers 20 and the tunnel dielectric layer 60, and a charge blocking layer 40 that surrounds the floating gate electrodes 50.

However, in such a floating gate structure, although the operation characteristic of the nonvolatile memory device is excellent when compared to the charge trap structure, a limitation is likely to be caused in that, since a minimum cell size W1 is large, it is difficult to increase the degree of integration. Also, in the case where the floating gate electrodes 50 are formed of a doped polysilicon, a depletion phenomenon may occur in which dopants in the floating gate electrodes 50 diffuse to an outside and degrade the electrical characteristics of the nonvolatile memory device. Therefore, development of a structure capable of solving these problems is demanded in the art.

SUMMARY

Embodiments of the present invention are directed to a nonvolatile memory device in which floating gate electrodes are formed of a metal-semiconductor compound so that the size of a unit cell is decreased to increase the degree of integration and a depletion phenomenon does not occur in the floating gate electrodes to improve the operation characteristics of the nonvolatile memory device, and a method for fabricating the same.

In accordance with an embodiment of the present invention, a nonvolatile memory device may include: a substrate, a channel layer projecting from a surface of the substrate, in a direction perpendicular to the surface; a tunnel dielectric layer surrounding the channel layer; a plurality of interlayer dielectric layers and a plurality of control gate electrodes alternately formed along the channel layer; floating gate electrodes interposed between the tunnel dielectric layer and the plurality of control gate electrodes, the floating gate electrodes including a metal-semiconductor compound; and a charge blocking layer interposed between each of the plurality of control gate electrodes and each of the plurality of floating gate electrodes.

In accordance with another embodiment of the present invention, a method for fabricating a nonvolatile memory device may include alternately forming a plurality of interlayer dielectric layers and a plurality of sacrificial layers over a substrate; defining a hole through the interlayer dielectric layers and the sacrificial layers to expose the substrate; forming a semiconductor layer in the hole; defining trenches on both sides of the hole to a depth that passes through the plurality of sacrificial layers; removing the sacrificial layers that are exposed due to the defining of the trenches to create spaces between the interlayer dielectric layers; forming floating gate electrodes, comprising a metal-semiconductor compound, from portions of a side surface of the semiconductor layer that have been exposed due to the removal of the sacrificial layers; and forming a charge blocking layer and a control gate electrode in each of the spaces.

Thanks to the above embodiments, since floating gate electrodes are formed of a metal-semiconductor compound, the size of a unit cell may be decreased to increase the degree of integration, and a depletion phenomenon does not occur in the floating gate electrodes to improve the operation characteristics of the nonvolatile memory device.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
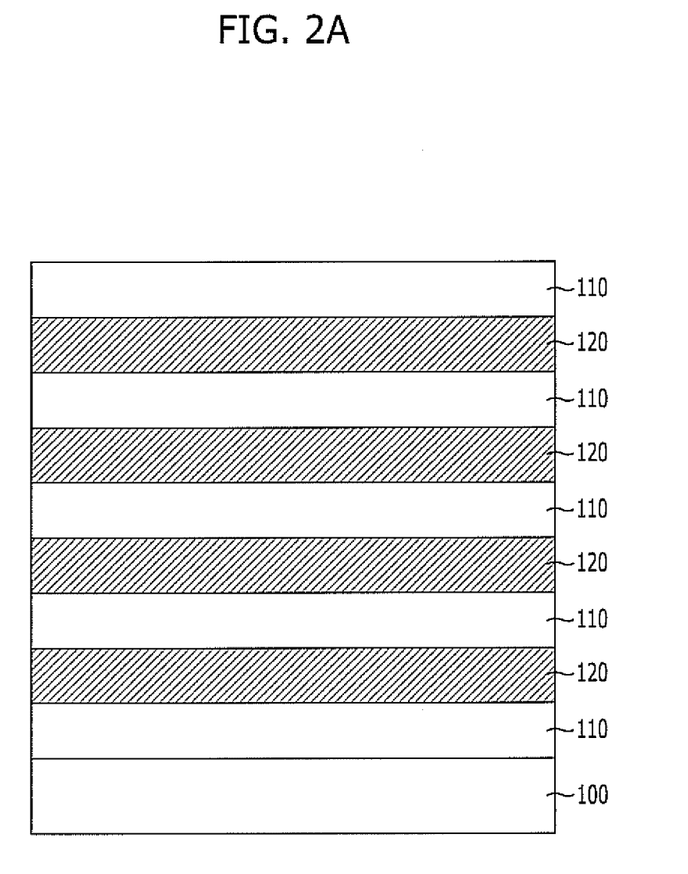
FIGS. 2A to 2H are cross-sectional views explaining a nonvolatile memory device and a method for fabricating the same in accordance with embodiments of the present invention.
Figure 2B:
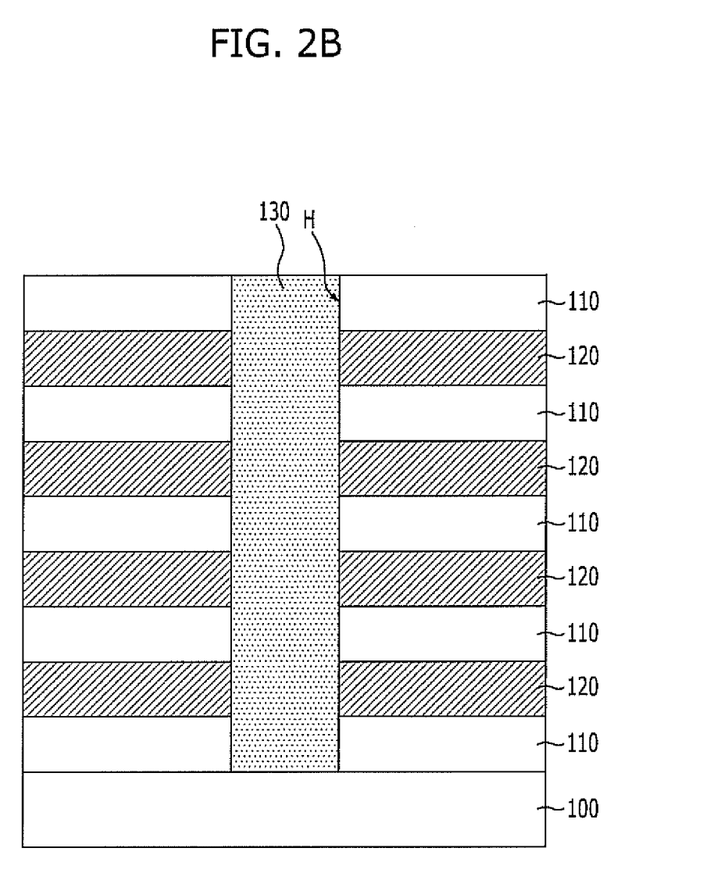
Figure 2C:
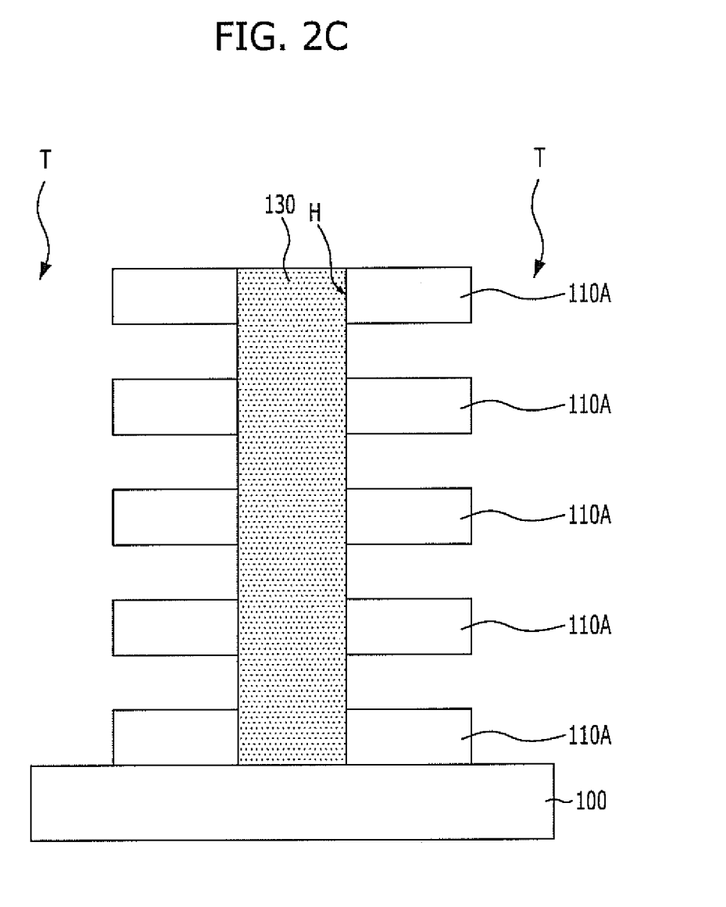
Figure 2D:
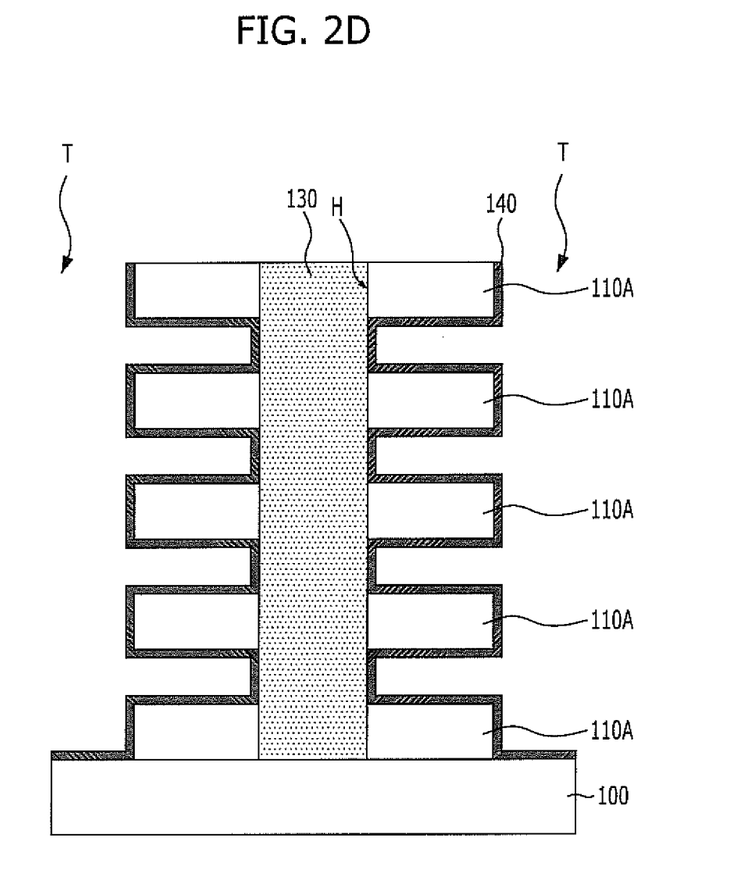
Figure 2E:
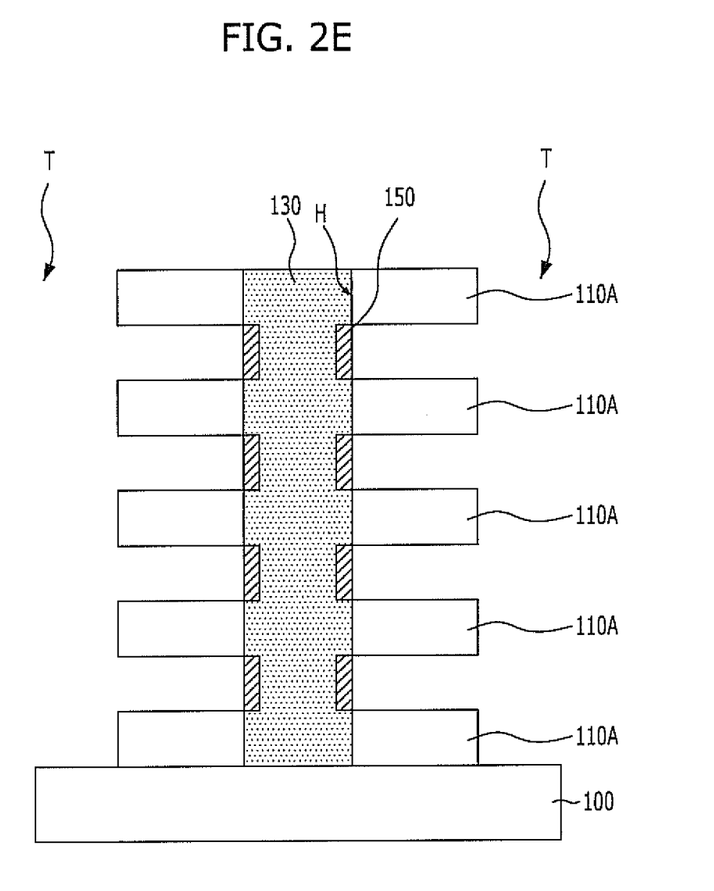
Figure 2F:
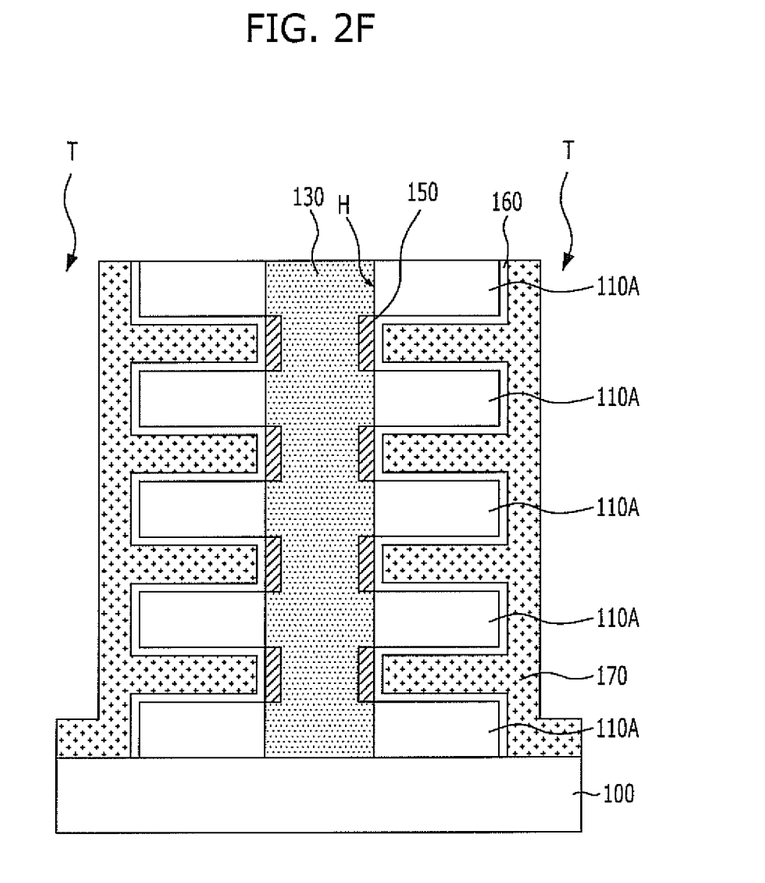
Figure 2G:
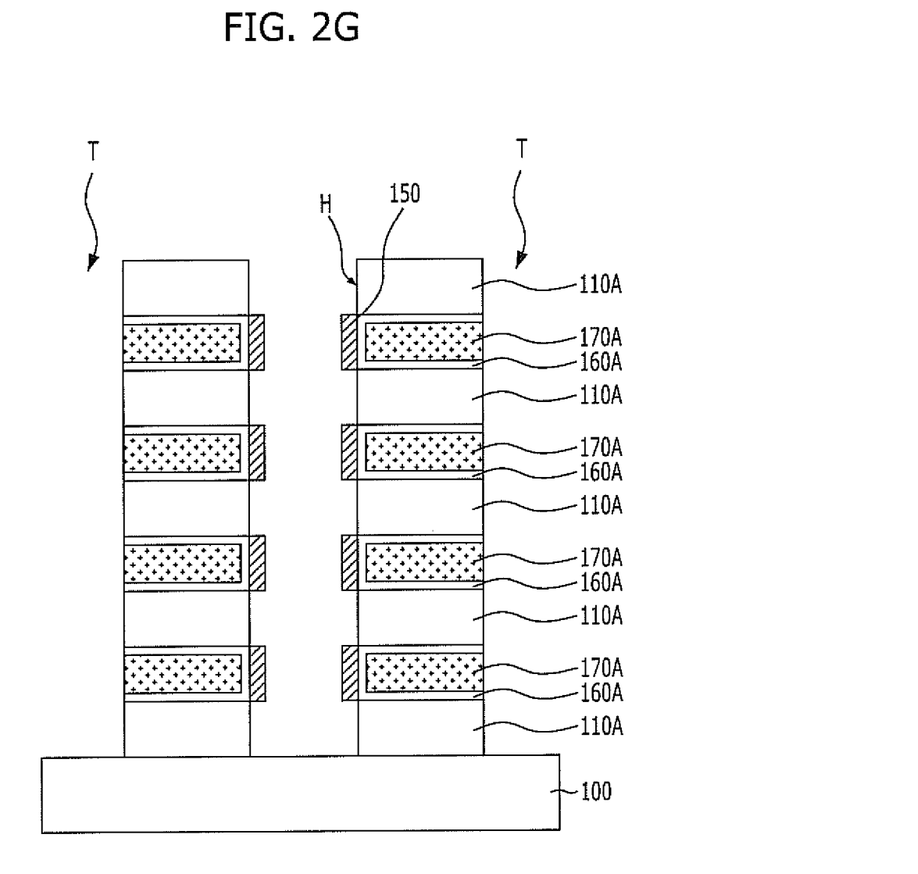
Figure 2H:
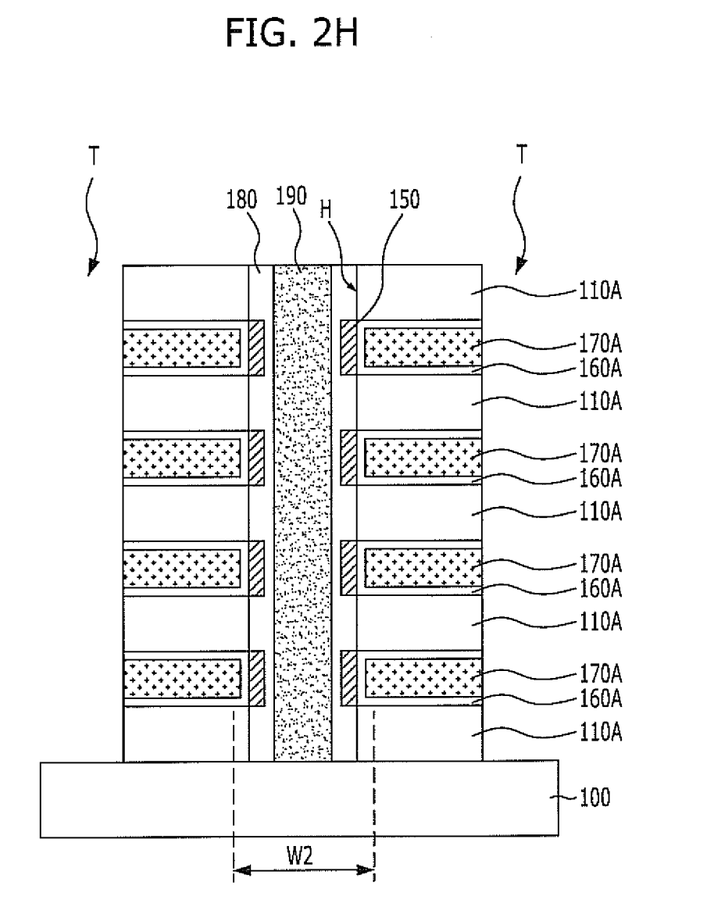

FIGS. 2A to 2H are cross-sectional views explaining a nonvolatile memory device and a method for fabricating the same in accordance with embodiments of the present invention. In particular, FIG. 2H is a cross-sectional view showing the nonvolatile memory device in accordance with the embodiment of the present invention, and FIGS. 2A to 2G are cross-sectional views showing the processes for fabricating the nonvolatile memory device of FIG. 2H.

Referring to FIG. 2A, a plurality of interlayer dielectric layers 110 and a plurality of sacrificial layers 120 are alternately stacked on a substrate 100. The substrate 100 may be a semiconductor substrate, such as monocrystalline silicon, and may include a predetermined underlying structure (not shown). Hereinafter, for the sake of convenience in explanation, the structure in which the plurality of interlayer dielectric layers 110 and the plurality of sacrificial layers 120 are alternately stacked will be referred to as a stack structure.

The interlayer dielectric layers 110 may be disposed at the upper and lower ends of the stack structure. The interlayer dielectric layers 110 may be formed of an oxide-based substance, such as silicon oxide ($SiO_2$). The sacrificial layers 120 are layers that are removed in a subsequent process to provide spaces for forming control gate electrodes, and may be formed of a substance (e.g., a nitride-based material) with an etching rate that is greater than the etching rate of the interlayer dielectric layers 110. While four sacrificial layers 120 are shown in the drawing, this is nothing but an illustration, and it is to be noted that the sacrificial layers 120 may be formed to have a number larger or smaller than four.

Referring to FIG. 2B, by selectively etching the stack structure, a hole H is defined to expose the substrate 100. The hole H may have the sectional shape of a circle or an ellipse when viewed from the top. A plurality of holes H may be arranged in a matrix arrangement. In particular, in the case where the stack structure is formed by alternately stacking oxide layers and nitride layers, etching for achieving a vertical etching profile may be easily carried out when compared to the conventional art in which oxide layers and polysilicon layers are alternately stacked.

Then, a semiconductor layer 130 is formed in the hole H. The semiconductor layer 130 may be formed through deposition or growth of a semiconductor substance, such as silicon (Si) or germanium (Ge). The semiconductor substance may have an amorphous phase or a polycrystalline phase and may be an undoped substance, an N-doped, or P-doped substance.

Referring to FIG. 2C, by selectively etching the stack structure on both sides of the hole H, trenches T are defined to pass through the interlayer dielectric layers 110 and the sacrificial layers 120. A plurality of trenches T may be arranged parallel to one another and may extend in a direction crossing the cross-section of the drawing. The remaining portions of the interlayer dielectric layers 110 will be referred to as interlayer dielectric layer patterns 110A.

The sacrificial layers 120 that are exposed due to defining of the trenches T are removed using a wet etching process.

Referring to FIG. 2D, a metal layer 140 is formed on the walls of the spaces created due to the removal of the sacrificial layers 120 and on the walls of the trenches T. The metal layer 140 may include a metal that can react with a semiconductor substance, such as silicon (Si) or germanium (Ge), to form a compound, such as t least any one selected from the group comprising cobalt (Co), nickel (Ni), titanium (Ti), platinum (Pt), or palladium (Pd).

The metal layer 140 may be formed by conformally depositing the metal by, for example, atomic layer deposition (ALD) or chemical vapor deposition (CVD).

Referring to FIG. 2E, the substrate 100, the semiconductor layer 130, and the metal layer 140 are annealed. The annealing process may be performed by, for example, rapid thermal annealing (RTA) or furnace annealing. As a result of this process, floating gate electrodes 150, which are constituted by a metal-semiconductor compound produced through reaction of the semiconductor layer 130 and the metal layer 140, are formed. The floating gate electrodes 150 may be formed in such a manner that the width, measured in a direction parallel to the substrate 100, of the floating gate electrodes 150 is smaller than a width, measured in a direction parallel to the substrate 100, of control gate electrodes, as will be described later.

The metal-semiconductor compound may include a metal silicide, such as a cobalt silicide ($CoSi_x$), a nickel silicide ($NiSi_x$), a titanium silicide ($TiSi_x$), a platinum silicide ($PtSi_x$), or a palladium silicide ($PdSi_x$). Alternatively, the metal-semiconductor compound may include a metal germanide. In particular, by forming the floating gate electrodes 150 using the metal-semiconductor compound, it is possible to prevent the occurrence of a depletion phenomenon that otherwise occurs in the conventional polysilicon gate electrodes, and a size of the floating gate electrodes 150 may be significantly reduced.

Next, a stripping process is performed to remove any of the metal layer 140 that remains after the annealing process. In order to remove the remaining metal layer 140, a mixed solution of sulfuric acid ($H_2SO_4$) and hydrogen peroxide ($H_2O_2$), that is, an SPM (sulfuric acid and hydro-peroxide mixture) may be used. An annealing process may be additionally performed after the stripping process.

Referring to FIG. 2F, a charge blocking layer 160 is formed on the walls of the spaces created due to the removal of the metal layer 140 and on the walls of the trenches T. The charge blocking layer 160 is to prevent the charges stored in the floating gate electrodes 150 from migrating to an outside, and may be formed by conformally depositing an oxide-based substance by, for example, ALD or CVD.

Thereafter, a conductive layer 170 for control gate electrodes is formed on the charge blocking layer 160. The conductive layer 170 for control gate electrodes may be formed by depositing a conductive substance, such as a metal, to a thickness that fills the spaces created due to the removal of the sacrificial layers 120 and the trenches T. For example, the conductive layer 170 for control gate electrodes may be formed by nucleating tungsten and then depositing bulk tungsten. Meanwhile, before forming the conductive layer 170 for control gate electrodes, in order to improve interfacial characteristics, a barrier metal layer may be formed by additionally depositing titanium nitride (TiN) on the charge blocking layer 160.

Referring to FIG. 2G, by etching the charge blocking layer 160 and the conductive layer 170 for control gate electrodes in the trenches T until the side surfaces of the interlayer dielectric layer patterns 110A are exposed, the charge blocking layer 160 and the conductive layer 170 for control gate electrodes form separate layers. As a result of this process, control gate electrodes 170A are formed between the interlayer dielectric layer patterns 110A. The remaining portions of the charge blocking layer 160 are referred to as charge blocking layer patterns 160A.

By removing the semiconductor layer 130 remaining in the hole H, the floating gate electrodes 150 are exposed. In order to remove the semiconductor layer 130, a wet etching process using an etching selectivity with respect to the floating gate electrodes 150 may be performed.

Referring to FIG. 2H, a tunnel dielectric layer 180 is formed on the floating gate electrodes 150, along a sidewall of the hole H. The tunnel dielectric layer 180 is for tunneling of charges and may be formed by depositing an oxide-based substance by, for example, ALD or CVD.

Then, a channel layer 190 is formed in the hole H in which the tunnel dielectric layer 180 is formed. The channel layer 190 may be formed by depositing or growing a semiconductor substance, for example, polysilicon. While, in the present embodiment, the channel layer 190 may be formed to a thickness that completely fills the hole H, it is to be noted that the present invention is not limited to such and, in another embodiment, the channel layer 190 may be formed to a thickness that does not completely fill the hole H.

By the fabrication method described above, the nonvolatile memory device in accordance with the embodiment of the present invention as shown in FIG. 2H may be fabricated.

Referring to FIG. 2H, the nonvolatile memory device in accordance with the embodiment of the present invention may include the channel layer 190 which projects perpendicular to a surface of the substrate 100, the tunnel dielectric layer 180 that surrounds the side surface of the channel layer 190, the plurality of interlayer dielectric layer patterns 110A and the plurality of control gate electrodes 170A that are alternately stacked along the channel layer 190, the floating gate electrodes 150 that are interposed between the tunnel dielectric layer 180 and the control gate electrodes 170A and include the metal-semiconductor compound, and the charge blocking layer patterns 160A that are interposed between the control gate electrodes 170A and the floating gate electrodes 150 and between the control gate electrodes 170A and the interlayer dielectric layer patterns 110A.

The metal-semiconductor compound may include a metal silicide or a metal germanide, and portions of the tunnel dielectric layer 180 that are interposed between the floating gate electrodes 150 and the channel layer 190 may be thinner than portions of the tunnel dielectric layer 180 which are interposed between the interlayer dielectric layer patterns 110A and the channel layer 190.

Furthermore, the floating gate electrodes 150 may project beyond the side surfaces of the interlayer dielectric layer patterns 110A, toward the channel layer 190, and may be formed in such a manner that the width, measured in the direction parallel to the substrate 100, of the floating gate electrodes 150 is smaller than the width, measured in the direction parallel to the substrate 100, of the control gate electrodes 170A. In particular, since the floating gate electrodes 150 are formed thin, a minimum cell size W2 is significantly reduced.

As is apparent from the above descriptions, in the nonvolatile memory device and the method for fabricating the same according to the embodiments of the present invention, since floating gate electrodes are formed of a metal-semiconductor compound, the size of a unit cell may be decreased to increase the degree of integration, and a depletion phenomenon does not occur in the floating gate electrodes to improve the operation characteristics of the nonvolatile memory device.

While the present invention has been described with respect to the specific embodiments, it will be apparent to those skilled in the art that various changes and modifications may be made without departing from the spirit and scope of the invention as defined in the following claims.

What is claimed:

1. A method for fabricating a nonvolatile memory device, the method comprising:
   alternately forming a plurality of interlayer dielectric layers and a plurality of sacrificial layers over a substrate;
   defining a hole through the interlayer dielectric layers and the sacrificial layers to expose the substrate;
   forming a semiconductor layer in the hole;
   defining trenches on both sides of the hole to a depth that passes through the plurality of sacrificial layers;
   removing the sacrificial layers that are exposed due to the defining of the trenches to create spaces between the interlayer dielectric layers;
   forming floating gate electrodes, comprising a metal-semiconductor compound, from portions of a side surface of the semiconductor layer that have been exposed due to the removal of the sacrificial layers; and
   forming a charge blocking layer and a control gate electrode in each of the spaces,
   wherein the floating gate electrodes are protruded beyond side surfaces of the interlayer dielectric layers toward a vertical channel layer to be formed in the hole.

2. The method according to claim 1, wherein forming the floating gate electrodes comprises:
   forming a metal layer in the spaces that have been created due to the removal of the sacrificial layers; and
   reacting the metal layer and the semiconductor layer with each other to form a metal-semiconductor compound.

3. The method according to claim 2, wherein forming the metal-semiconductor compound comprises:
   annealing the metal layer and the semiconductor layer.

4. The method according to claim 2, wherein, after forming the metal-semiconductor compound, the method further comprises:
   removing any unreacted metal layer.

5. The method according to claim 1, wherein the metal-semiconductor compound comprises a metal silicide or a metal germanide.

6. The method according to claim 1, wherein the sacrificial layers are formed of a substance which has an etching rate that is greater than the etching rate of the interlayer dielectric layers.

7. The method according to claim 1, wherein the floating gate electrodes are formed such that a width, measured in a direction parallel to the substrate, of each of the floating gate electrodes is smaller than a width, measured in a direction parallel to the substrate, of each of the control gate electrodes.

8. The method according to claim 1, wherein, after forming the control gate electrodes, the method further comprises:
   removing the semiconductor layer; and
   forming a tunnel dielectric layer on the floating gate electrodes that have been exposed due to removal of the semiconductor layer.

9. The method according to claim 8, wherein, after forming the tunnel dielectric layer, the method further comprises:
   forming the vertical channel layer in the hole.

* * * * *